US012573587B2

(12) United States Patent
Engerer et al.

(10) Patent No.:    US 12,573,587 B2
(45) **Date of Patent:    \*Mar. 10, 2026**

(54) CONCENTRATED SOLAR IRRADIATION OF TARGETS IN PLASMAS

(71) Applicant: National Technology & Engineering Solutions of Sandia, LLC, Albuquerque, NM (US)

(72) Inventors: Jeffrey Daniel Engerer, Cedar Crest, NM (US); Nicholas Andrew Anderson, Albuquerque, NM (US); Lindsay Lawless, Lafayette, IN (US)

(73) Assignee: National Technology & Engineering Solutions of Sandia, LLC, Albuquerque, NM (US)

( \* ) Notice:    Subject to any disclaimer, the term of this patent is extended or adjusted under 35 U.S.C. 154(b) by 445 days.

This patent is subject to a terminal disclaimer.

(21) Appl. No.: 18/139,999

(22) Filed:    Apr. 27, 2023

(65)    Prior Publication Data

US 2024/0363308 A1    Oct. 31, 2024

(51) Int. Cl.

| | |
|---|---|
| *G01N 25/00* | (2006.01) |
| *H01J 37/16* | (2006.01) |
| *H01J 37/18* | (2006.01) |
| *H01J 37/32* | (2006.01) |
| *H05B 3/00* | (2006.01) |

(52) U.S. Cl.
CPC ........ *H01J 37/32082* (2013.01); *G01N 25/00* (2013.01); *H01J 37/165* (2013.01); *H01J 37/18* (2013.01); *H01J 37/32715* (2013.01); *H05B 3/0033* (2013.01); *H01J 2237/002* (2013.01); *H01J 2237/026* (2013.01); *H01J 2237/16* (2013.01); *H01J 2237/24585* (2013.01)

(58) Field of Classification Search
None
See application file for complete search history.

(56)    References Cited

U.S. PATENT DOCUMENTS

| | | | | |
|---|---|---|---|---|
| 12,436,073 B2 * | 10/2025 | Engerer | .................. | G01N 3/56 |
| 2003/0118064 A1 * | 6/2003 | Zhao | ..................... | H01S 3/0632 |
| | | | | 372/39 |
| 2005/0121607 A1 * | 6/2005 | Miller | .................. | H05H 1/2406 |
| | | | | 250/288 |
| 2006/0228897 A1 * | 10/2006 | Timans | ............. | H01L 21/67115 |
| | | | | 438/758 |
| 2010/0019141 A1 * | 1/2010 | Olson | ................... | H01J 37/304 |
| | | | | 250/397 |
| 2020/0199748 A1 * | 6/2020 | Pandey | ............. | H01J 37/32357 |
| 2021/0265153 A1 * | 8/2021 | Cheung | .................. | G01N 21/71 |

\* cited by examiner

*Primary Examiner* — Erica S Lin
(74) *Attorney, Agent, or Firm* — Yee & Associates, P.C.; Gregory M. Doudnikoff; Mario A. Burgarello

(57)    ABSTRACT

An apparatus for thermal ablation testing is provided. The apparatus comprises a chamber; an optically transparent window in the chamber; a sample holder inside the chamber; a test sample in the sample holder; a number of bare-wire thermocouples connected to the test sample, wherein the thermocouples generate temperature data in the form of voltage; a mass balance inside the chamber, wherein the mass balance is configured to hold the sample holder and dynamically detect changes in mass of the test sample; an external radiant heat source configured to heat the test sample through the window; a plasma source configured to generate a number of atomic species in the chamber; and a pyrometer directed at the test sample.

12 Claims, 7 Drawing Sheets

600

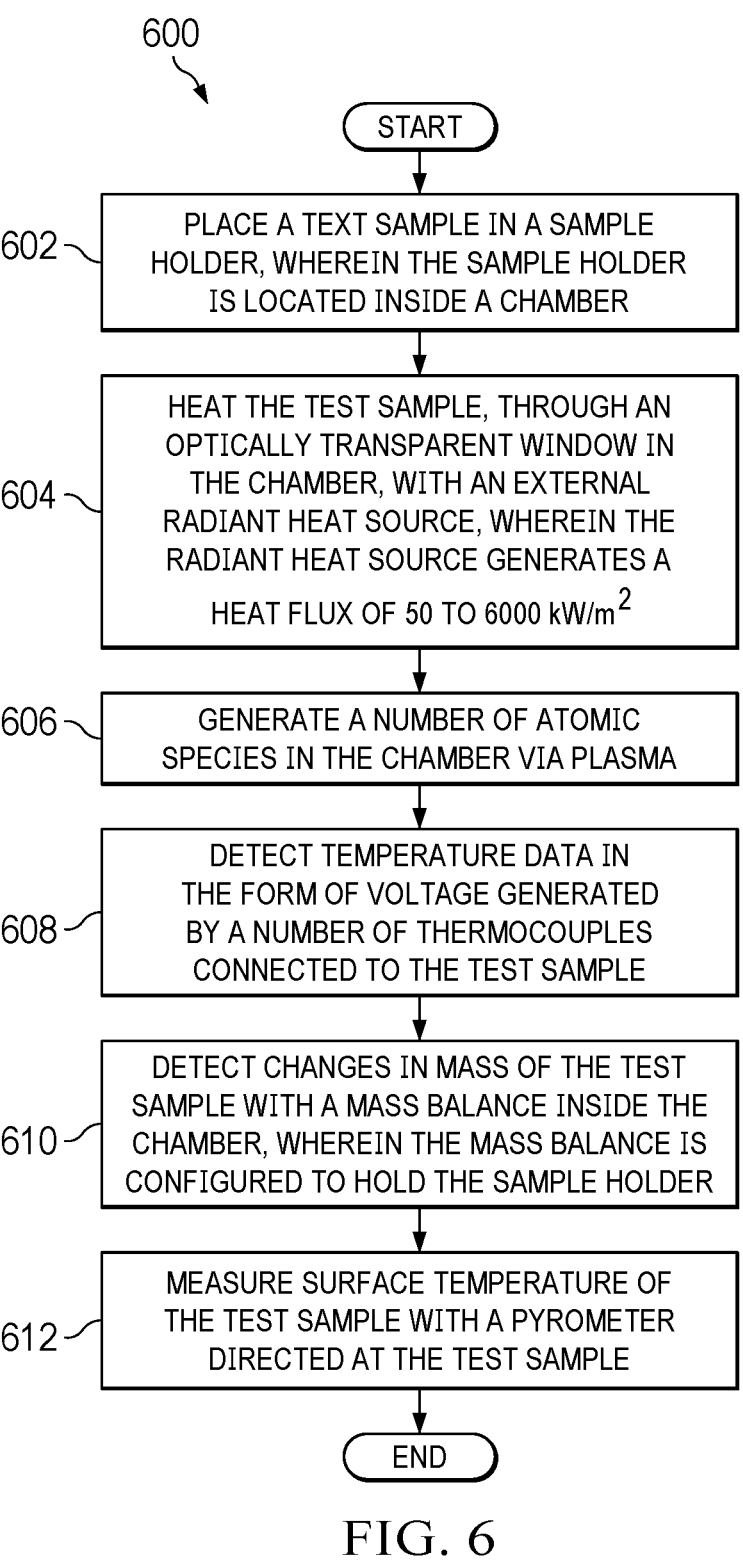

START

602 — PLACE A TEXT SAMPLE IN A SAMPLE HOLDER, WHEREIN THE SAMPLE HOLDER IS LOCATED INSIDE A CHAMBER

604 — HEAT THE TEST SAMPLE, THROUGH AN OPTICALLY TRANSPARENT WINDOW IN THE CHAMBER, WITH AN EXTERNAL RADIANT HEAT SOURCE, WHEREIN THE RADIANT HEAT SOURCE GENERATES A HEAT FLUX OF 50 TO 6000 kW/m$^2$

606 — GENERATE A NUMBER OF ATOMIC SPECIES IN THE CHAMBER VIA PLASMA

608 — DETECT TEMPERATURE DATA IN THE FORM OF VOLTAGE GENERATED BY A NUMBER OF THERMOCOUPLES CONNECTED TO THE TEST SAMPLE

610 — DETECT CHANGES IN MASS OF THE TEST SAMPLE WITH A MASS BALANCE INSIDE THE CHAMBER, WHEREIN THE MASS BALANCE IS CONFIGURED TO HOLD THE SAMPLE HOLDER

612 — MEASURE SURFACE TEMPERATURE OF THE TEST SAMPLE WITH A PYROMETER DIRECTED AT THE TEST SAMPLE

END

FIG. 6

CONCENTRATED SOLAR IRRADIATION OF TARGETS IN PLASMAS

STATEMENT OF GOVERNMENT INTEREST

This invention was made with United States Government support under Contract No. DE-NA0003525 between National Technology & Engineering Solutions of Sandia, LLC and the United States Department of Energy. The United States Government has certain rights in this invention.

BACKGROUND

1. Field

The present disclosure relates generally to solar-thermal testing and more specifically to thermal-modal validation.

2. Background

Solar furnace facilities provide testing of ablation materials at high heat flux for extended durations while exposed to chemical species relevant to hypersonic flight. Solar-furnace experiments have exposed stockpile and newly formulated ablators to extreme radiant-heating environments. These experiments have fielded dynamic temperature measurements, but with limited success/fidelity.

Ablation/TPS (thermal protection system) experiments are conventionally performed in arc-jet, and more recently, plasma-torch facilities. These facilities produce convective heating environments that mimic flight conditions, but the measurements and boundary conditions are too crude for the development of finite-rate chemistry models. Moreover, the physics are complex and coupled, obfuscating underlying phenomena (e.g., spallation vs. oxidation). Scientific apparatuses (e.g., molecular beam and flow-tube reactors) improve measurement fidelity but sacrifice flight-relevant temperatures (<2000° C.) and oxidation rates.

Therefore, it would be desirable to have a method and apparatus that take into account at least some of the issues discussed above, as well as other possible issues.

SUMMARY

An illustrative embodiment provides an apparatus for thermal ablation testing. The apparatus comprises: a chamber; an optically transparent window in the chamber; a sample holder inside the chamber; a test sample in the sample holder; a number of bare-wire thermocouples connected to the test sample, wherein the thermocouples generate temperature data in the form of voltage; a mass balance inside the chamber, wherein the mass balance is configured to hold the sample holder and dynamically detect changes in mass of the test sample; an external radiant heat source configured to heat the test sample through the window; a plasma source configured to generate a number of atomic species in the chamber; and a pyrometer directed at the test sample.

Another illustrative embodiment provides an apparatus for thermal ablation testing. The apparatus comprises: a chamber with an optically transparent window; a test sample in a sample holder inside the chamber; a mass balance inside the chamber, wherein the mass balance is configured to hold the sample holder and dynamically detect changes in mass of the test sample; a number of wire thermocouples connected to the test sample, wherein the wire thermocouples generate temperature data in the form of voltage; a vacuum pump connected to the chamber, wherein the vacuum pump is configured to control atmospheric pressure within the chamber; a mass-flow controller connected to the chamber, wherein the mass-flow controller is configured to pump a purge gas into the chamber; an external radiant heat source configured to heat the test sample through the window; a water-cooled heat shield within the chamber between the test sample and radiant heat source, wherein the heat shield comprises an aperture through which the test sample is exposed to the radiant heat source; a plasma source configured to generate a number of atomic species in the chamber; and a pyrometer directed at the test sample.

Another embodiment provides a method of thermal ablation testing. The method comprises placing a test sample in a sample holder, wherein the sample holder is located inside a chamber. The test sample is heated, through an optically transparent window in the chamber, with an external radiant heat source, wherein the radiant heat source generates a heat flux of 50 to 6000 $kW/m^2$. A number of atomic species are generated in the chamber via plasma. Temperature data is detected in the form of voltage generated by a number of thermocouples connected to the test sample. Changes in mass of the test sample are dynamically detected with a mass balance inside the chamber, wherein the mass balance is configured to hold the sample holder. Surface temperature of the test sample is measured with a pyrometer directed at the test sample.

The features and functions can be achieved independently in various examples of the present disclosure or may be combined in yet other examples in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 6 depicts a flowchart illustrating a process for thermal ablation testing in accordance with illustrative embodiments.

DETAILED DESCRIPTION

The illustrative embodiments recognize and take into account one or more different considerations. For example, the present embodiments recognize and take into account that ablation/TPS (thermal protection system) experiments are conventionally performed in arc-jet, and more recently, plasma-torch facilities. These facilities produce convective heating environments that mimic flight conditions, but the measurements and boundary conditions are too crude (±50% convection uncertainty) for the development of finite-rate chemistry models. Moreover, the physics are complex and coupled, obfuscating underlying phenomena (e.g., spallation vs. oxidation). Scientific apparatuses (e.g., molecular beam and flow-tube reactors) improve measurement fidelity but sacrifice flight-relevant temperatures (<2000° C.) and oxidation rates.

The illustrative embodiments also recognize and take into account that recent solar-furnace experiments have exposed stockpile and newly formulated ablators to extreme radiant-heating environments (up to 6 MW/m^2).

The illustrative embodiments provide a High-Heat Flux (>>10 W/cm$^2$) radiant-heat facility for materials testing under well-controlled boundary conditions and simultaneous temperature and mass measurements. The illustrative embodiments dynamically measure mass loss during exposures to concentrated heat flux and atomic species generated via plasma.

The illustrative embodiments include a radiant-heat mass balance that produces data revealing pyrolysis rates in high-heat-flux and oxidizing environments, mitigating overdependence on low-heating-rate laboratory measurements (i.e., thermogravimetric analysis). Concentrated solar heat flux is combined with atomic species generated via plasma to recreate hypersonic flight conditions. Ablative materials are exposed to high heart flux in a solar furnace while a 500 W radio frequency signal generates a plasma flowing into the test chamber. The solar furnace can generate temperatures up to 3000° C., typically operating above 1000° C.

The illustrative embodiments enable the evaluation of material performance under extreme conditions representative of reentry and can separately control heat flux, pressure, and oxidant concentration. Unlike complex, coupled physics of conventional facilities, the illustrative embodiments allow independent control of heating and oxidation phenomena, allowing quantification of competing mechanisms.

Figure 1:
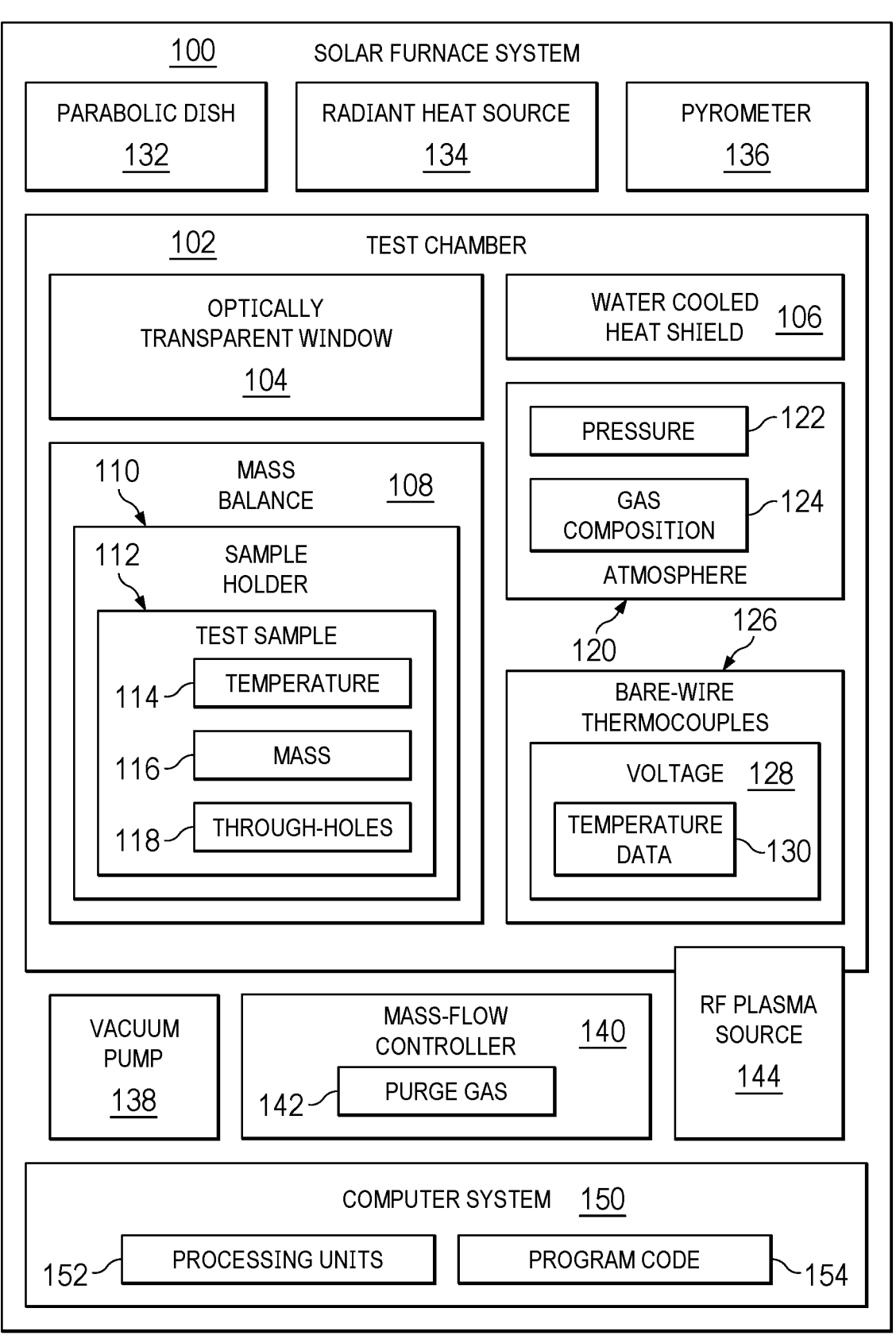
FIG. 1 depicts a block diagram of a solar furnace system in accordance with an illustrative embodiment.

FIG. 1 depicts a block diagram of a solar furnace system in accordance with an illustrative embodiment. Solar furnace system 100 comprises a test chamber 102 in which a test sample 112 is located for testing.

Test chamber 102 includes a transparent window 104 through which a radiant heat source 134 heats the test sample 112. In an embodiment, radiant heat source 134 may comprise the sun. A parabolic dish 132 may facilitate the heating (i.e., by focusing sun rays). A water cooled heat shield 106 with an aperture in front of the test sample 112 may be used to shield the rest of the interior of the test chamber 102 from the radiant heat source 134.

The test sample 112 is placed in a sample holder 110, which in turn is supported on a mass balance 108 inside the test chamber 102. Mass balance 108 measures changes in the mass 116 of the test sample resulting from ablation.

A number of bare-wire thermocouples 126 may be connected to the test sample 112 via through-holes 118 in the test sample. The bare-wire thermocouples 126 measure the temperature 114 of the test sample 112 by generating voltage 128 representing temperature data 130 in response to heating of the test sample by radiant heat source 134. Surface temperature of the test sample 112 may be measured by a pyrometer 136, which may be located either inside or outside the test chamber 102.

A vacuum pump 138 and mass-flow controller 140 may be used to control the atmosphere 120 within the test chamber 102. The vacuum pump 138 may be used to evacuate the test chamber 102 to create a vacuum environment. Mass-flow controller 140 may be used to pressurize the test chamber 102. The pressurization may be accomplished with air or an inert purge gas 142 such as nitrogen.

A radio frequency (RF) plasma source 144 directs a plasma into the test chamber 102 to enable evaluation of material performance of the test sample 112 under reactive conditions. RF plasma source 144 can be used to create atomic species such as, e.g., oxygen and nitrogen. Gases can be mixed in any desired concentration (e.g., N, O, $N_2$, $O_2$, etc.). It should be noted that atomic species may also be created by other methods known in the art.

The components of solar furnace system 100, including data gathering, may be controlled by a computer system 150. Computer system 150 is a physical hardware system and includes one or more data processing systems. When more than one data processing system is present in computer system 150, those data processing systems are in communication with each other using a communications medium. The communications medium can be a network. The data processing systems can be selected from at least one of a computer, a server computer, a tablet computer, or some other suitable data processing system.

As depicted, computer system 150 includes a number of processor units 152 that are capable of executing program code 154 implementing processes in the illustrative examples. As used herein, a processor unit in the number of processor units 152 is a hardware device and is comprised of hardware circuits such as those on an integrated circuit that respond and process instructions and program code that operate a computer. When a number of processor units 152 execute program code 154 for a process, the number of processor units 152 is one or more processor units that can be on the same computer or on different computers. In other words, the process can be distributed between processor units on the same or different computers in a computer system. Further, the number of processor units 152 can be of the same type or different type of processor units. For example, a number of processor units can be selected from at least one of a single core processor, a dual-core processor, a multi-processor core, a general-purpose central processing unit (CPU), a graphics processing unit (GPU), a digital signal processor (DSP), or some other type of processor unit.

Figure 2:
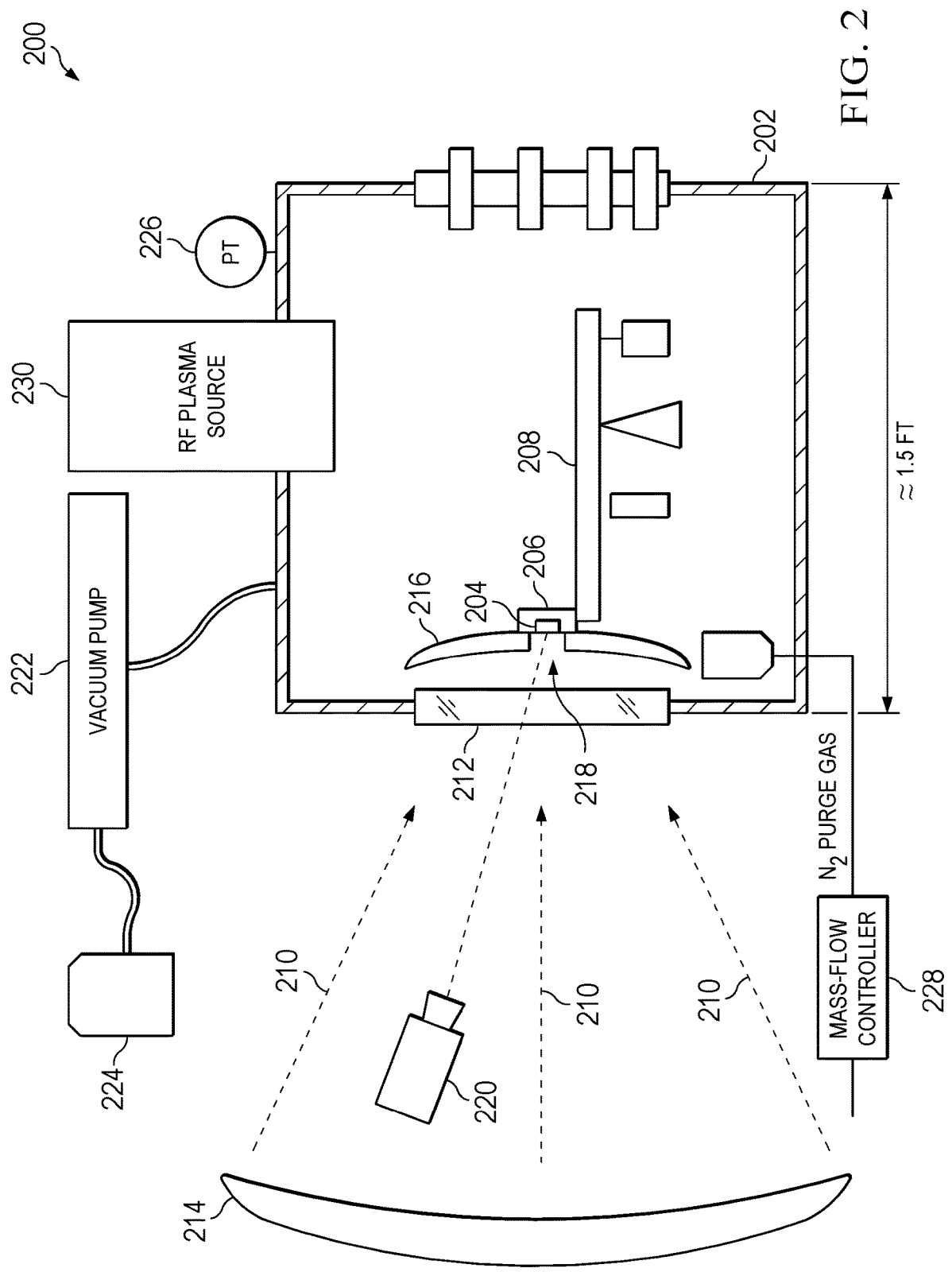
FIG. 2 depicts a pictorial diagram illustrating a solar furnace system in accordance with an illustrative embodiment.

FIG. 2 depicts a pictorial diagram illustrating a solar furnace in accordance with an illustrative embodiment. Solar furnace 200 is an example implementation of solar furnace system 100 in FIG. 1.

Test chamber 202 contains the test sample 204. In the present example, test sample 204 may be held in a clamshell sample holder 206. In alternate embodiments, the sample holder may be a sting-mounted holder. Clamshell sample holder 206 is positioned on mass balance 208, which is configured to detect changes in mass of the test sample 204 as a result of ablation and/or decomposition. In an embodiment, clamshell sample holder 206 may comprise, for example, LI-900 tile insulators for improved boundary conditions. Because the test sample 204 is surrounded by an insulator, the clamshell sample holder 206 reduces radial heat loss and constrains radial gas flow.

Radiant heat energy, indicated by arrows 210, enters the test chamber 202 through an optically transparent window 212. The radiant heat energy may generate a heat flux of 50 to 6000 kW/m$^2$. In the present example, the optically transparent window 212 may be made of quartz. Other materials such as sapphire may also be used for the optically transparent window 212. As shown, an external parabolic dish 214 may be used to direct the radiant heat energy 210 (e.g., from the sun or other broad spectrum radiant heat source) toward the optically transparent window 212. Parabolic dish 214 may be several meters in diameter.

Water cooled heat shield 216 protects instrumentation inside the test chamber 202 from radiant heat energy 210, but has an aperture 218 through which the test sample 204 is exposed to the heat.

Pyrometer 220 is directed at the test sample 204 to detect surface radiant heat energy indicating surface temperature of the test sample. In the illustrated example, pyrometer 220 is located external to the test chamber 202, but may also be located interiorly in other embodiments.

RF plasma source 230 directs a plasma into test chamber 202. In the present example, the RF plasma source may be a plasma coil that generates up to a 500 W radio frequency (RF) signal. Alternatively, other methods of molecular dissociation for generating atomic species may be used in place of RF plasma source 230. Integrating RF plasma source 230 into solar furnace 200 enables resolution of finite-rate chemistry of TPS materials at temperatures and heat fluxes of ablation environments. This combination of elements provides measurable, well-characterized chemistry (diffusive reactions with molecular and monatomic oxygen) combined with sufficient temperatures and materials capabilities to maintain ablation-relevant, independently controllable conditions.

The atmosphere within the test chamber 202 can be a vacuum or pressurized. The internal atmosphere may be controlled with a vacuum pump 222, which in the present example is connected to a HEPA filter 224. Vacuum pump 222 may be able to reduce pressure within the test chamber 202 to two Torr or lower. Internal pressure may be monitored and measured with a pressure transducer 226. Mass-flow controller 228 may be used to purge the test chamber 202 with an inert purge gas such as nitrogen ($N_2$).

Figure 3:
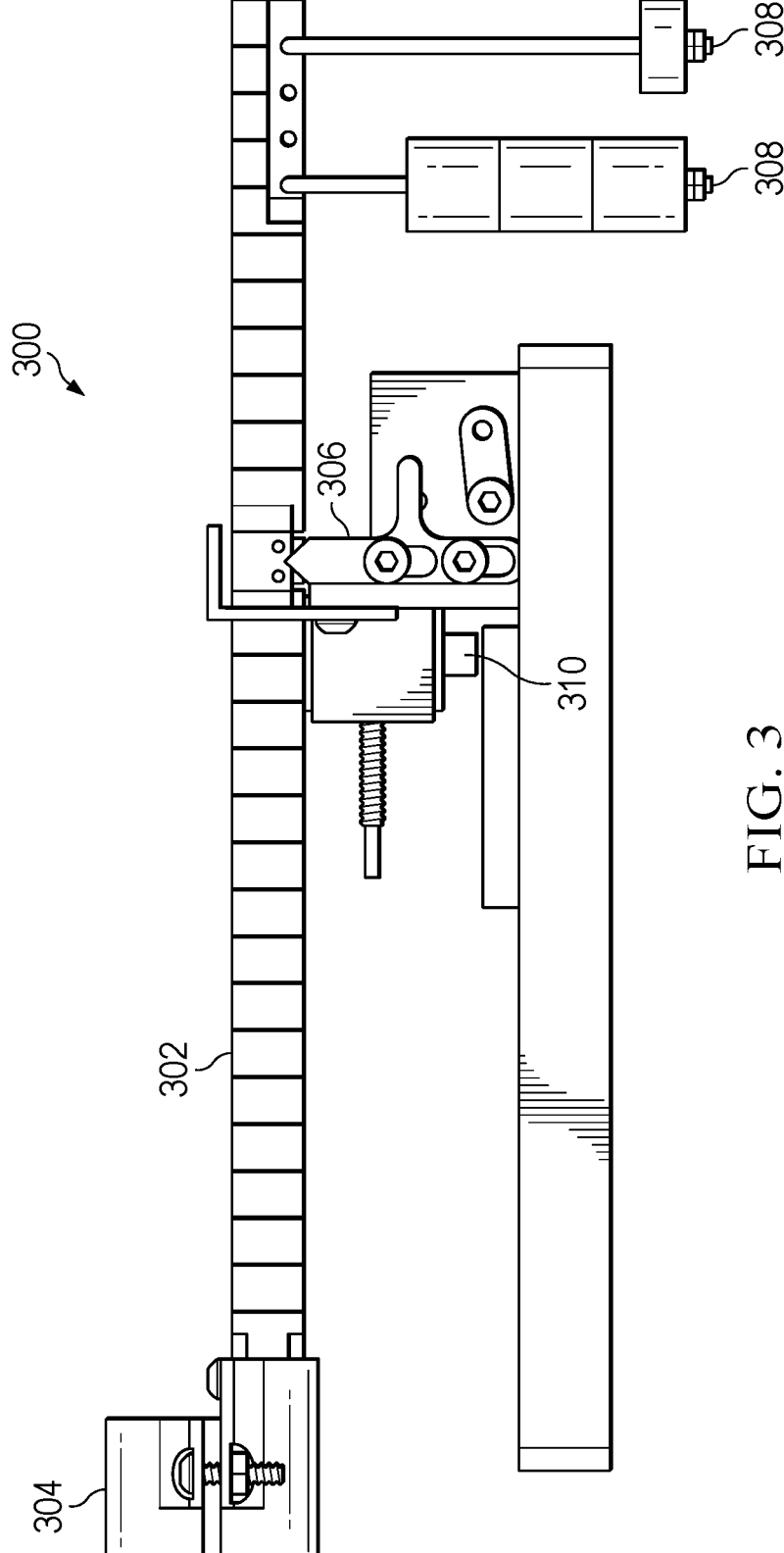
FIG. 3 depicts a side view pictorial diagram of a mass balance in accordance with an illustrative embodiment.
Figure 4:
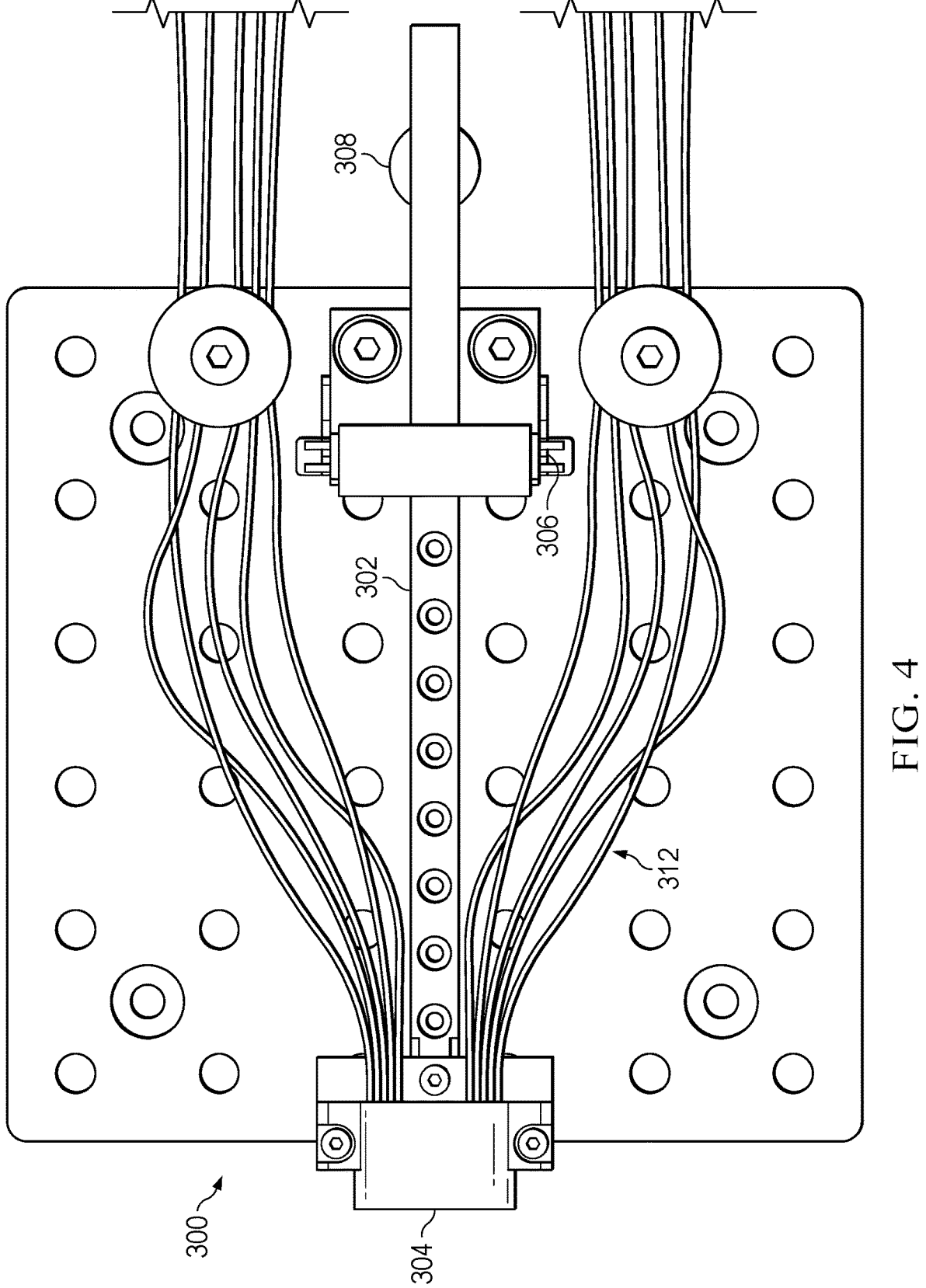
FIG. 4 depicts a top view pictorial diagram of the mass balance in accordance with an illustrative embodiment.

FIG. 3 depicts side view pictorial diagram of a mass balance in accordance with an illustrative embodiment. FIG. 4 depicts top view pictorial diagram of the mass balance in accordance with an illustrative embodiment. Mass balance 300 is an example implementation of mass balance 208 in FIG. 2.

Mass balance 300 comprises a lever arm 302 pivotally mounted on a fulcrum 306. A clamshell sample holder 304 is mounted at a first end of the lever arm 302. Counterweight 308 is attached to the opposite end of the lever arm 302. As the test sample loses mass due to ablation, the counterweight 308 will gradually pull down the opposite end of the lever arm 302, which is detected by transducer 310. Therefore, mass balance 300 is able to dynamically measure the mass of the test sample during heating.

FIG. 4 shows wire thermocouples 312 connected to the test sample in the clamshell sample holder 304. These thermocouples 312 provide temperature data from the test sample in the form of voltages.

Figure 5:
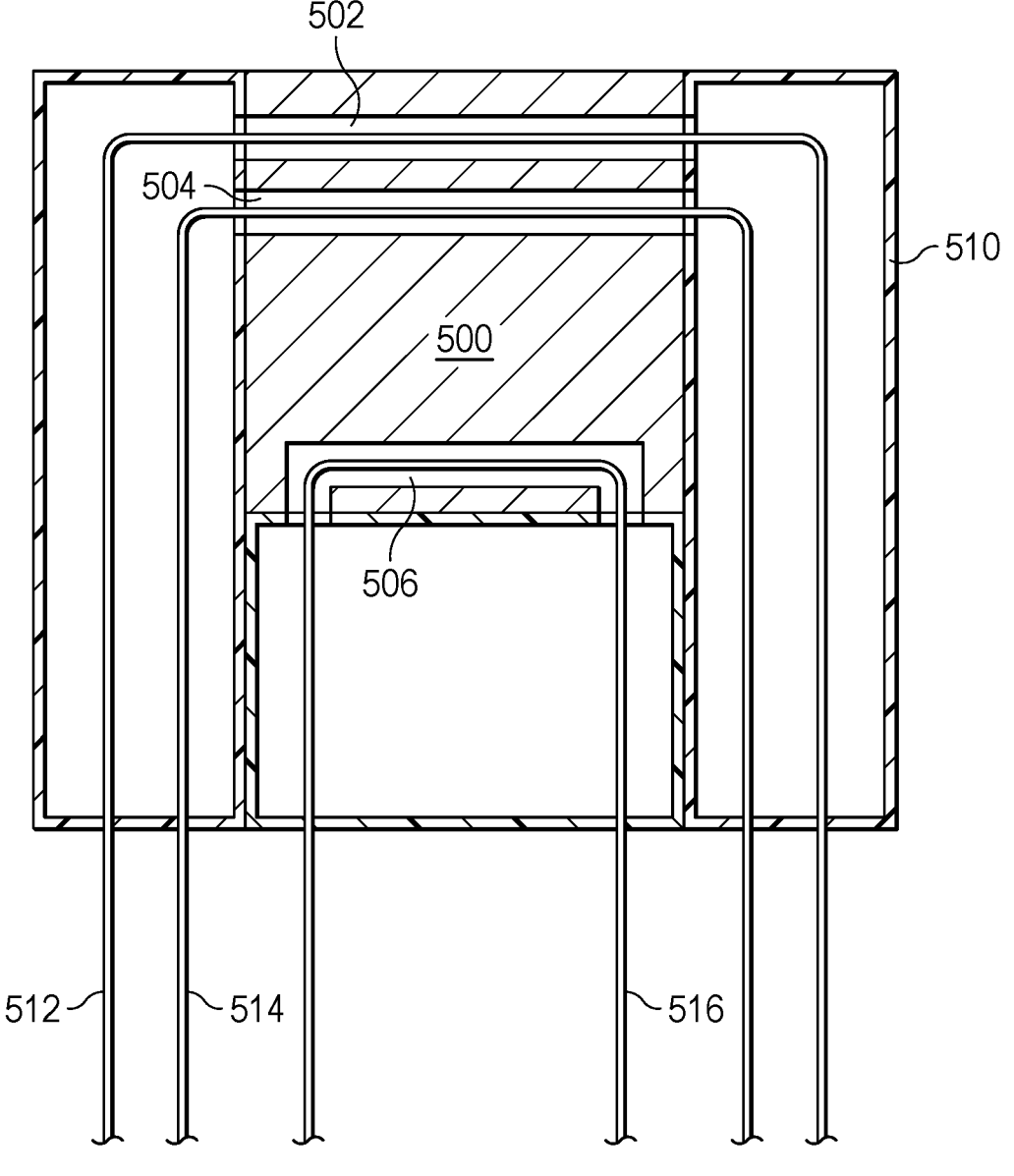
FIG. 5 depicts a cross-section pictorial diagram of a test sample with thermocouples in accordance with an illustrative embodiment.

FIG. 5 depicts a cross-section pictorial diagram of a test sample with thermocouples in accordance with an illustrative embodiment. Test sample 500 is mounted in clamshell 510 and is an example of test sample 204 in FIG. 2. As shown, the test sample 500 comprises a number of through-holes 502, 504, 506 through which bare-wire thermocouples 512, 514, 516 pass, respectively.

Through-holes 502, 504, 506 may have a diameter of 0.003 inch (0.0762 mm) or greater and are formed in test sample 500 via laser machining. Bare-wire thermocouples 512, 514, 516 may comprise 35 AWG wire.

As the test sample 500 is heated by the radiant heat source, the bare-wire thermocouples 512, 514, 516 generate voltage representing temperature data.

FIG. 6 depicts a flowchart illustrating a process for thermal ablation testing in accordance with illustrative embodiments. Process 600 might be implemented in solar furnace system 100 shown in FIG. 1 and solar furnace 200 in FIG. 2.

Process 600 begins by placing a test sample in a sample holder, wherein the sample holder is located inside a chamber (step 602).

The test sample is heated, through an optically transparent window in the chamber, with an external radiant heat source, wherein the radiant heat source generates a heat flux of 50 to 6000 $kW/m^2$ (step 604).

A number of atomic species are generated in the chamber via plasma (step 606). The atomic species may be generated from a RF plasma source or other known molecular dissociation methods.

Temperature data is detected in the form of voltage generated by a number of thermocouples connected to the test sample (step 608).

Changes in mass of the test sample are dynamically detected with a mass balance inside the chamber, wherein the mass balance is configured to hold the sample holder (step 610).

Surface temperature of the test sample is measured with a pyrometer directed at the test sample (step 612). After a specified duration of heating, process 600 ends.

Figure 7:
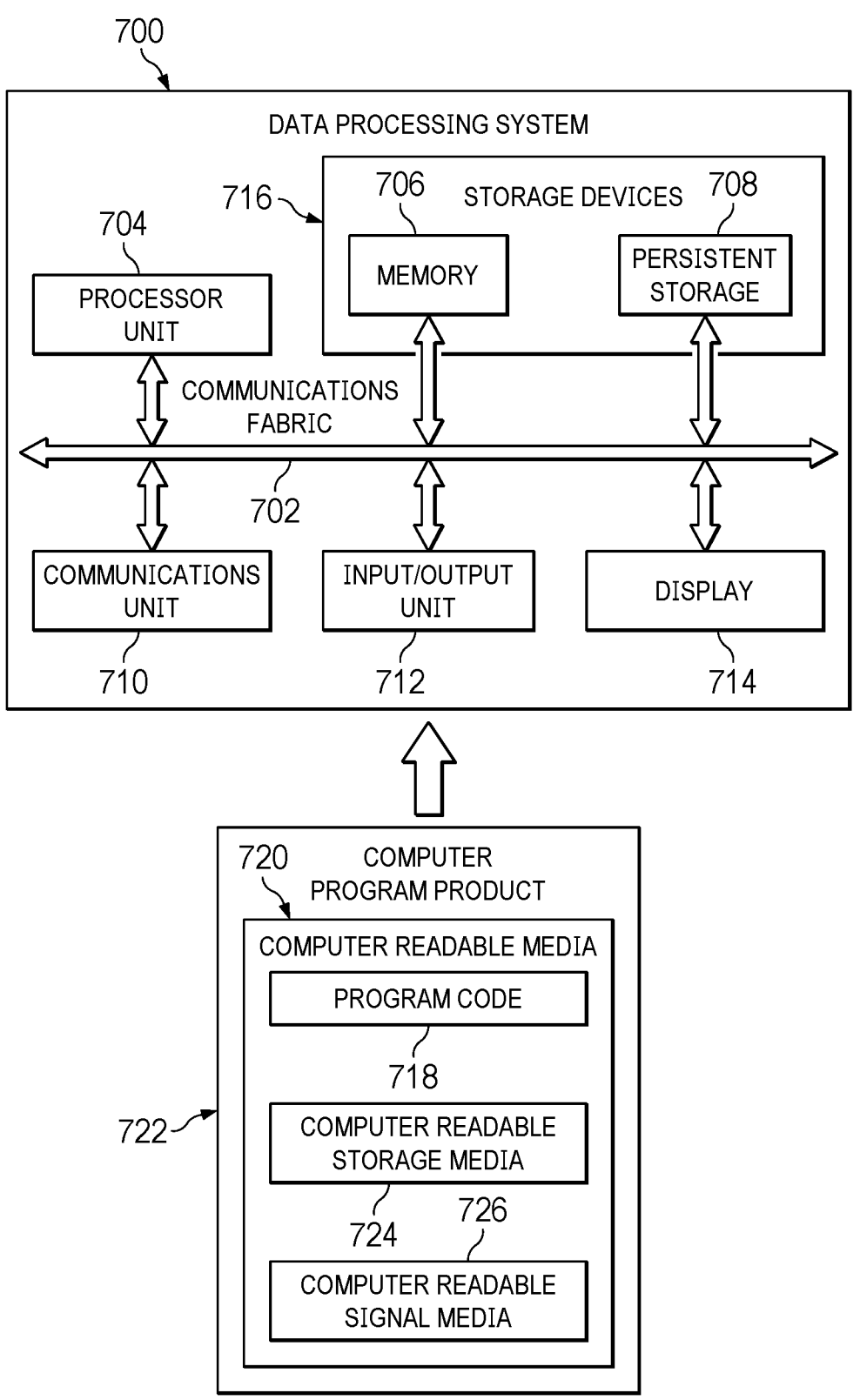
FIG. 7 is a diagram of a data processing system depicted in accordance with an illustrative embodiment.

Turning now to FIG. 7, an illustration of a block diagram of a data processing system is depicted in accordance with an illustrative embodiment. Data processing system 700 may be used to implement computer system 150 in FIG. 1. In this illustrative example, data processing system 700 includes communications fabric 702, which provides communications between processor unit 704, memory 706, persistent storage 708, communications unit 710, input/output unit 712, and display 714. In this example, communications fabric 702 may take the form of a bus system.

Processor unit 704 serves to execute instructions for software that may be loaded into memory 706. Processor unit 704 may be a number of processors, a multi-processor core, or some other type of processor, depending on the particular implementation. In an embodiment, processor unit 704 comprises one or more conventional general-purpose central processing units (CPUs). In an alternate embodiment, processor unit 704 comprises one or more graphical processing units (GPUs).

Memory 706 and persistent storage 708 are examples of storage devices 716. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 716 may also be referred to as computer-readable storage devices in these illustrative examples. Memory 706, in these examples, may be, for example, a random access memory or any other suitable volatile or non-volatile storage device. Persistent storage 708 may take various forms, depending on the particular implementation.

For example, persistent storage 708 may contain one or more components or devices. For example, persistent storage 708 may be a hard drive, a flash memory, a rewritable optical disk, a rewritable magnetic tape, or some combination of the above. The media used by persistent storage 708 also may be removable. For example, a removable hard drive may be used for persistent storage 708. Communications unit 710, in these illustrative examples, provides for communications with other data processing systems or devices. In these illustrative examples, communications unit 710 is a network interface card.

Input/output unit 712 allows for input and output of data with other devices that may be connected to data processing system 700. For example, input/output unit 712 may provide a connection for user input through at least one of a keyboard, a mouse, or some other suitable input device. Further, input/output unit 712 may send output to a printer. Display 714 provides a mechanism to display information to a user.

Instructions for at least one of the operating system, applications, or programs may be located in storage devices 716, which are in communication with processor unit 704 through communications fabric 702. The processes of the different embodiments may be performed by processor unit 704 using computer-implemented instructions, which may be located in a memory, such as memory 706.

These instructions are referred to as program code, computer-usable program code, or computer-readable program code that may be read and executed by a processor in processor unit 704. The program code in the different embodiments may be embodied on different physical or computer-readable storage media, such as memory 706 or persistent storage 708.

Program code 718 is located in a functional form on computer-readable media 720 that is selectively removable and may be loaded onto or transferred to data processing system 700 for execution by processor unit 704. Program code 718 and computer-readable media 720 form computer program product 722 in these illustrative examples. In one example, computer-readable media 720 may be computer-readable storage media 724 or computer-readable signal media 726.

In these illustrative examples, computer-readable storage media 724 is a physical or tangible storage device used to store program code 718 rather than a medium that propagates or transmits program code 718. Computer readable storage media 724, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Alternatively, program code 718 may be transferred to data processing system 700 using computer-readable signal media 726. Computer-readable signal media 726 may be, for example, a propagated data signal containing program code 718. For example, computer-readable signal media 726 may be at least one of an electromagnetic signal, an optical signal, or any other suitable type of signal. These signals may be transmitted over at least one of communications links, such as wireless communications links, optical fiber cable, coaxial cable, a wire, or any other suitable type of communications link.

The different components illustrated for data processing system 700 are not meant to provide architectural limitations to the manner in which different embodiments may be implemented. The different illustrative embodiments may be implemented in a data processing system including components in addition to or in place of those illustrated for data processing system 700. Other components shown in FIG. 7 can be varied from the illustrative examples shown. The different embodiments may be implemented using any hardware device or system capable of running program code 718.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component may be configured to perform the action or operation described. For example, the component may have a configuration or design for a structure that provides the component an ability to perform the action or operation that is described in the illustrative examples as being performed by the component. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus for thermal ablation testing, the apparatus comprising:

a chamber;

an optically transparent window in the chamber;

a sample holder inside the chamber;

a test sample in the sample holder;

a number of bare-wire thermocouples connected to the test sample, wherein the thermocouples generate temperature data in the form of voltage;

a mass balance inside the chamber, wherein the mass balance is configured to hold the sample holder and dynamically detect changes in mass of the test sample;

an external radiant heat source configured to heat the test sample through the window;

a plasma source configured to generate a number of atomic species in the chamber; and a pyrometer directed at the test sample.

2. The apparatus of claim 1, further comprising an external parabolic dish positioned to direct energy from the radiant heat source through the window into the chamber.

3. The apparatus of claim 1, further comprising a water-cooled heat shield within the chamber between the test sample and radiant heat source, wherein the heat shield comprises an aperture through which the test sample is exposed to the radiant heat source.

4. The apparatus of claim 1, wherein the radiant heat source generates a heat flux of 50 to 6000 kW/m$^2$.

5. The apparatus of claim 1, wherein the test sample comprises a number of through-holes having a diameter of 0.003 inch or greater through which the bare-wire thermocouples pass.

6. The apparatus of claim 1, wherein the chamber is a vacuum chamber with an internal pressure of two Torr or lower.

7. The apparatus of claim 1, wherein the chamber is a pressurized chamber.

8. The apparatus of claim 7, wherein the chamber is pressurized with an inert gas or air.

9. The apparatus of claim 1, wherein the chamber is purged with an inert gas.

10. The apparatus of claim 1, wherein the sample holder comprises a clamshell holder or sting-mounted holder.

11. The apparatus of claim 1, wherein the optically transparent window comprises quartz or sapphire.

12. The apparatus of claim 1, wherein the plasma source is a radio frequency plasma generator.

* * * * *